(12) United States Patent
Suto et al.

(10) Patent No.: US 11,527,615 B2
(45) Date of Patent: Dec. 13, 2022

(54) SEMICONDUCTOR DEVICE

(71) Applicant: HITACHI, LTD., Tokyo (JP)

(72) Inventors: Takeru Suto, Tokyo (JP); Naoki Tega, Tokyo (JP); Naoki Watanabe, Tokyo (JP); Hiroshi Miki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 52 days.

(21) Appl. No.: 17/080,946

(22) Filed: Oct. 27, 2020

(65) Prior Publication Data

US 2021/0143255 A1 May 13, 2021

(30) Foreign Application Priority Data

Nov. 11, 2019 (JP) .............................. JP2019-203639

(51) Int. Cl.
*H01L 29/08* (2006.01)
*H01L 29/78* (2006.01)
*H01L 29/06* (2006.01)
*H01L 29/10* (2006.01)
*H01L 29/45* (2006.01)
*H01L 29/16* (2006.01)

(52) U.S. Cl.
CPC ...... *H01L 29/0852* (2013.01); *H01L 29/0696* (2013.01); *H01L 29/1079* (2013.01); *H01L 29/7803* (2013.01); *H01L 29/7813* (2013.01); *H01L 29/1608* (2013.01); *H01L 29/45* (2013.01)

(58) Field of Classification Search
CPC ............. H01L 29/0619; H01L 29/1608; H01L 29/1095; H01L 21/02529; H01L 29/0657
See application file for complete search history.

(56) References Cited

U.S. PATENT DOCUMENTS

| 9,887,285 B1 * | 2/2018 | Oota ................... H01L 29/0619 |
| 2017/0098647 A1 | 4/2017 | Uchida et al. |
| 2017/0330961 A1 * | 11/2017 | Tega ................. H01L 29/66068 |
| 2019/0229211 A1 | 7/2019 | Bu et al. |

FOREIGN PATENT DOCUMENTS

| JP | 2015-162577 A | 9/2015 |
| JP | 2017-069551 A | 4/2017 |
| JP | 2019-125760 A | 7/2019 |

* cited by examiner

*Primary Examiner* — Xiaoming Liu
(74) *Attorney, Agent, or Firm* — Volpe Koenig

(57) ABSTRACT

Provided is a semiconductor device whose performance is improved. A p type body region is formed in an n type semiconductor layer containing silicon carbide, and a gate electrode is formed on the body region with a gate insulating film interposed therebetween. An n type source region is formed in the body region on a side surface side of the gate electrode, and the body region and a source region are electrically connected to a source electrode. A p type field relaxation layer FRL is formed in the semiconductor layer on the side surface side of the gate electrode, and the source electrode is electrically connected to the field relaxation layer FRL. The field relaxation layer FRL constitutes a part of the JFET 2Q which is a rectifying element, and a depth of the field relaxation layer FRL is shallower than a depth of the body region.

13 Claims, 10 Drawing Sheets

B-B CROSS-SECTION

SEMICONDUCTOR DEVICE

BACKGROUND OF THE INVENTION

1. Field of the Invention

The present invention relates to a semiconductor device, and more particularly to a semiconductor device using silicon carbide.

2. Description of the Related Art

In a field effect transistor (metal insulator semiconductor field effect transistor: MISFET) which is one of power semiconductor devices, a power MISFET using a silicon (Si) (Si power MISFET) substrate has been mainly used in related arts. However, since a field strength against dielectric breakdown in silicon carbide (SiC) is about one digit larger as compared with a field strength in Si, a power MISFET using a SiC substrate (SiC power MISFET) has attracted attention.

For example, there is a technology in which, when a SiC power MISFET is used as a switching element, a reflux diode is connected in parallel in a direction opposite to that of the switching element for a purpose of protection from a surge current or the like.

JP-A-2015-162577 (PTL 1) discloses a SiC power MISFET having a junction field effect transistor (JFET) built in. Then, the JFET functions as a unipolar diode, and a gate and a source of the JFET are in ohmic contact with a source electrode of the SiC power MISFET.

JP-A-2017-69551 (PTL 2) discloses a MISFET that functions as a channel diode in which a low concentration impurity region is formed in a body region under a gate electrode, and a unipolar current is caused to flow from a source electrode to a drain electrode.

JP-A-2019-125760 (PTL 3) discloses a SiC power MISFET having a Schottky barrier diode built in.

In the SiC power MISFET, a pn type body diode that includes a body region and a semiconductor layer exists. For example, when the body diode is used as the reflux diode, both electrons and holes flow, and a bipolar current is generated. The bipolar current expands crystal defects inside the SiC substrate, and thereby performance of the SiC power MISFET is deteriorated. Therefore, a unipolar rectifying element through which one of electrons and holes flows is required.

Although the unipolar rectifying element may be formed on another semiconductor chip attached together with the semiconductor chip on which the SiC power MISFET is formed, in this case, there arises a problem that manufacturing cost increases, and performance of the semiconductor chip per unit area decreases. Therefore, a technology to improve the performance of the semiconductor device while preventing the increase in the manufacturing cost by forming the unipolar rectifying element in the same semiconductor chip (semiconductor device) as the SiC power MISFET is desired.

Other technical problems and novel characteristics will be apparent from a description of the description and accompanying drawings.

SUMMARY OF THE INVENTION

The typical ones of the embodiments disclosed in the present application will be briefly described as follows.

A semiconductor device according to one embodiment includes: a semiconductor substrate of a first conductivity type that has a front surface and a back surface which is on an opposite side of the front surface, and contains silicon carbide; a first semiconductor layer of the first conductivity type that is formed on the front surface of the semiconductor substrate, and contains silicon carbide; and a body region of a second conductivity type that is opposite to the first conductivity type formed in the first semiconductor layer; a gate insulating film that is formed on the body region. The semiconductor device also includes: a gate electrode that is formed on the gate insulating film, has a first side surface and a second side surface which is on an opposite side of the first side surface in a first direction, and extends in a second direction orthogonal to the first direction in a plan view; and a source region of the first conductivity type that is formed in the body region on the first side surface side of the gate electrode. The semiconductor device also includes: a source electrode that is formed on the body region and on the source region, and is electrically connected to the body region and the source region; and a drain electrode that is formed on the back surface side of the semiconductor substrate. Here, a field relaxation layer of the second conductivity type is formed in the first semiconductor layer on the second side surface side of the gate electrode, the source electrode is also formed on the field relaxation layer and is electrically connected to the field relaxation layer, and a depth of the field relaxation layer is smaller than a depth of the body region.

According to one embodiment, the performance of the semiconductor device can be improved.

DESCRIPTION OF THE PREFERRED EMBODIMENTS

Figure 1:
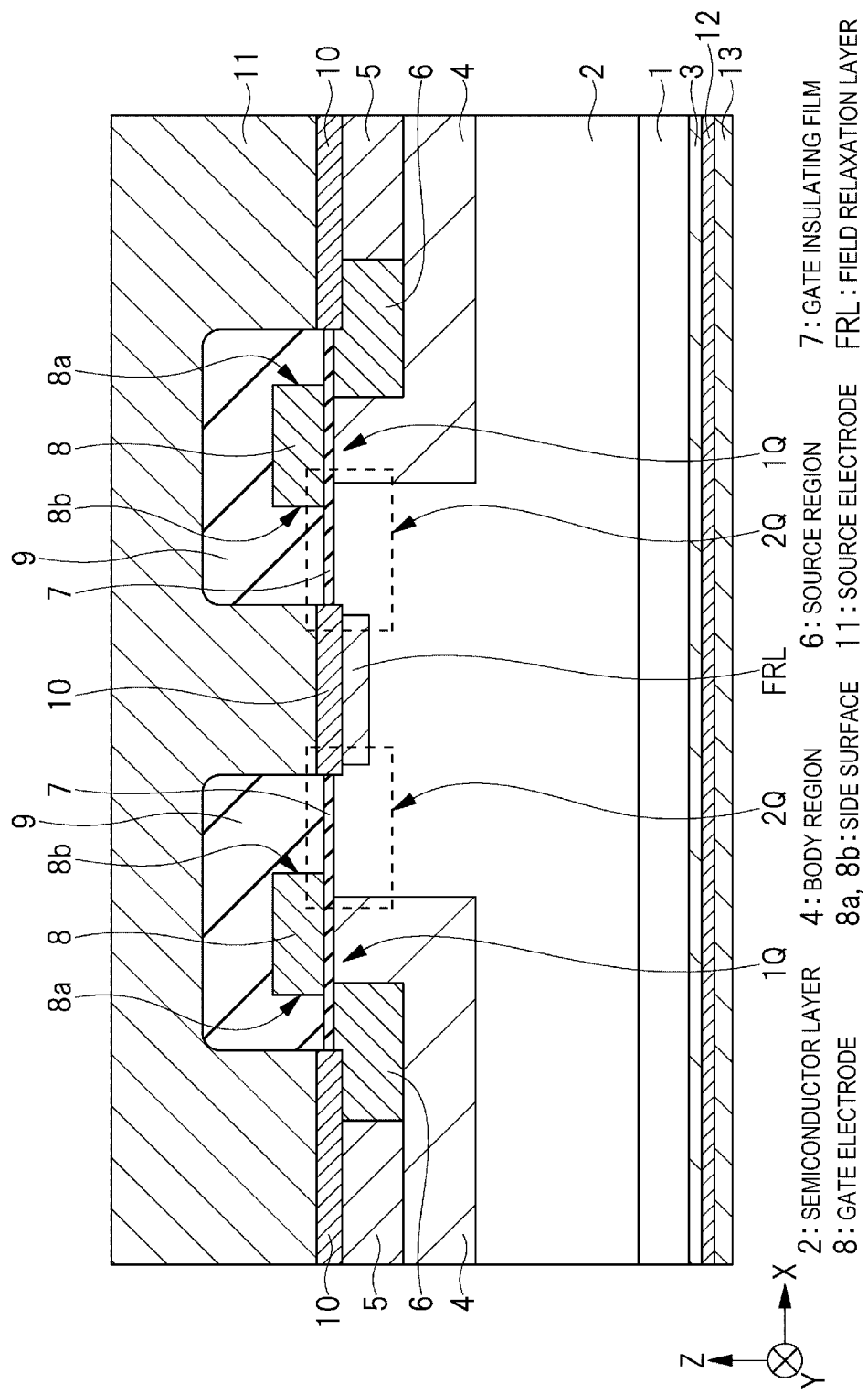
FIG. 1 is a cross-sectional view showing a semiconductor device according to a first embodiment.

Hereinafter, embodiments of the invention will be described in detail with reference to drawings. In all the drawings for describing the embodiments, members having same functions are denoted by same reference numerals, and repetitive description thereof will be omitted. In the following embodiments, description of the same or similar parts will not be repeated in principle unless particularly necessary.

In the drawings used in the embodiments, a hatching may be omitted in a cross-sectional view and may be given in a plan view in order to make the drawings easy to see.

The X direction and the Y direction described in the present application are orthogonal to each other, and a surface including the X direction and the Y direction is a plane. A Z direction is orthogonal to the X direction and the Y direction, and is a vertical direction perpendicular to the plane. In the present application, the Z direction may be described as a depth direction or a thickness direction of a certain structure.

Relating to a numerical range described in the embodiment, for example, a case described as "5 to 10" means "equal to or more than 5 and equal to or less than 10".

First Embodiment

<Structure of Semiconductor Device>

Figure 2:
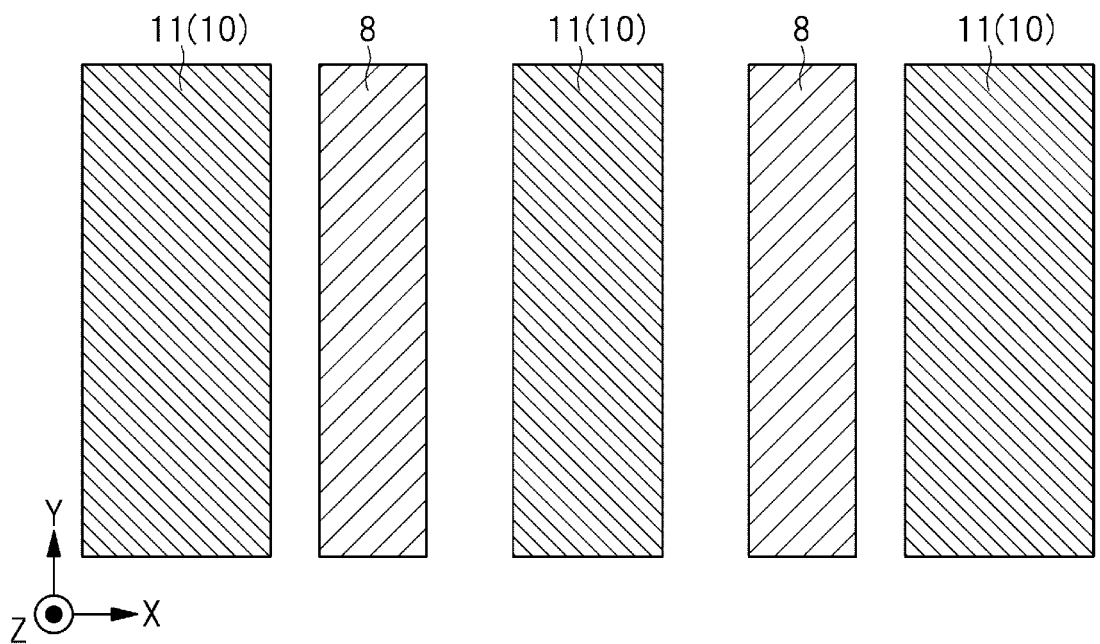
FIG. 2 is a plan view showing the semiconductor device according to the first embodiment.
Figure 3:
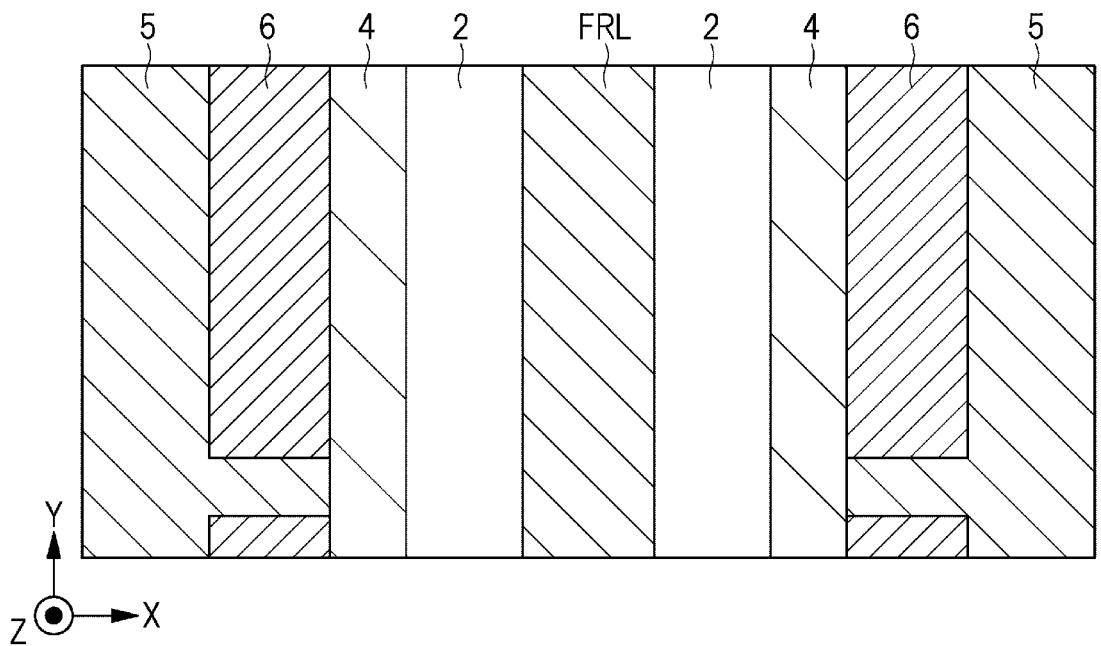
FIG. 3 is a plan view showing the semiconductor device according to the first embodiment.
Figure 4:
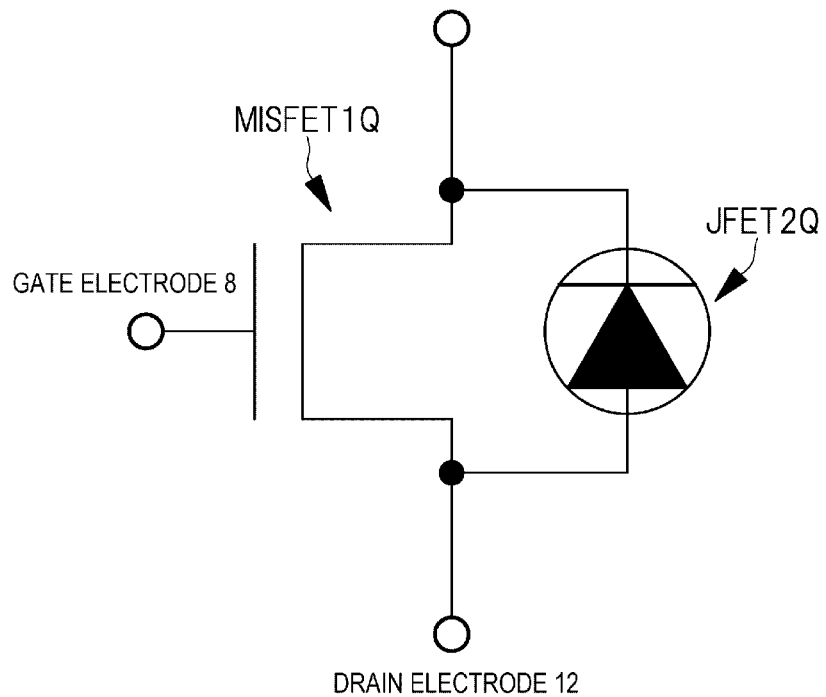
FIG. 4 is an equivalent circuit diagram showing the semiconductor device according to the first embodiment.

The semiconductor device (semiconductor chip) according to the first embodiment will be described below with reference to FIGS. 1 to 4. FIG. 1 is a cross-sectional view showing the semiconductor device, and FIGS. 2 and 3 are plan views showing the semiconductor device. FIG. 2 shows the locations of electrodes formed above the semiconductor layer 2, and FIG. 3 shows the locations of impurity regions formed inside the semiconductor layer 2. The semiconductor device according to the first embodiment has a MISFET 1Q as a switching element and a JFET 2Q which is a rectifying element, and FIG. 4 shows an equivalent circuit of the MISFET 1Q and the JFET 2Q.

A semiconductor substrate (substrate) 1 used in the first embodiment is a compound semiconductor substrate containing carbon and silicon, and contains silicon carbide (SiC). The semiconductor substrate 1 has n type conductivity and has a front surface and a back surface that is on an opposite side of the front surface.

An n type diffusion region (impurity region) 3 is formed on a back surface side of the semiconductor substrate 1. A silicide layer 12 is formed under the diffusion region 3, and a drain electrode 13 is formed below the silicide layer 12. The drain electrode 13 is, for example, a laminated film of a titanium (Ti) film, a nickel (Ni) film, and a gold (Au) film, and the drain electrode 13 has a thickness of, for example, 0.5 to 1.0 µm. The drain electrode 13 may be a single layer film formed of one of the films instead of a laminated film obtained from the films, or may be a conductive film different from the films.

The silicide layer 12 is a metal compound layer containing a material contained in the semiconductor substrate 1 (diffusion region 3) and a metal. The metal is, for example, nickel (Ni), and the silicide layer 12 is a metal silicide layer, for example, a nickel silicide (NiSi) layer. The diffusion region 3 is in ohmic contact with the silicide layer 12.

An n type semiconductor layer (epitaxial layer) 2 that has an impurity concentration lower than that of the semiconductor substrate 1 and contains silicon carbide (SiC) is formed on the front surface of the semiconductor substrate 1. The semiconductor layer 2 functions as a drift layer and is electrically connected to the drain electrode 13 with the diffusion region 3 and the silicide layer interposed therebetween. Therefore, a drain voltage Vd is applied from the drain electrode 13 to the semiconductor layer 2, the diffusion region 3, and the silicide layer 12.

A p type body region (impurity region) 4 is formed in the semiconductor layer 2. Gate electrodes 8 are formed on the body region 4 and the semiconductor layer 2 with gate insulating films 7 interposed therebetween. Each gate insulating film 7 is, for example, an insulating film containing silicon oxide, and each gate electrode 8 is, for example, a conductive film such as polycrystalline silicon into which an n type impurity is introduced. A gate voltage Vg is applied to each gate electrode 8. Each gate electrode 8 extends in the Y direction as shown in FIG. 2, and has a side surface 8a, and a side surface 8b that is on an opposite side of the side surface 8a in the X direction, as shown in FIG. 1.

On a side surface 8a side of each gate electrode 8, a p type contact region (impurity region) 5 and an n type source region (impurity region) 6 are formed in the body region 4. The contact region 5 has a higher impurity concentration than the body region 4, and the source region 6 has a higher impurity concentration than the semiconductor layer 2. The contact region 5 is provided mainly for a purpose of reducing contact resistance to the body region 4, and a part of the contact region 5 may be provided in a manner of dividing the source region 6 in the Y direction, as shown in FIG. 3.

On a side surface 8b side of the gate electrode 8, a p type field relaxation layer (impurity region) FRL is formed in the semiconductor layer 2. The field relaxation layer FRL has an impurity concentration substantially equal to or larger than that of the body region 4. In the first embodiment, the field relaxation layer FRL is separated from the body region 4 in the X direction.

The gate electrode 8 is covered with an interlayer insulating film 9. The interlayer insulating film 9 is, for example, an insulating film containing silicon oxide. An opening portion that opens on the contact region 5, the field relaxation layer FRL, and apart of the source region 6, is formed in the interlayer insulating film 9. In other words, the contact region 5, the field relaxation layer FRL, and the part of the source region 6 are exposed from the interlayer insulating film 9.

On the side surface 8a side of the gate electrode 8, a silicide layer 10 is formed between the contact region 5 and the part of the source region 6 and the source electrode 11. On the side surface 8b side of the gate electrode 8, the silicide layer 10 is also formed between the field relaxation layer FRL and the semiconductor layer 2 and the source electrode 11. The contact region 5, the field relaxation layer FRL, and the part of the source region 6 are electrically connected to the source electrode 11 with the silicide layer 10 interposed therebetween, and a source potential Vs is applied to the contact region 5, the field relaxation layer FRL, and the part of the source region 6.

The source electrode 11 is formed not only in the opening portion of the interlayer insulating film 9 but also on the interlayer insulating film 9. The source electrode 11 includes a barrier metal film and a conductive film formed on the barrier metal film. The barrier metal film is, for example, a laminated film including a titanium (Ti) film and a titanium nitride (TiN) film, and the conductive film is, for example, an aluminum (Al) film.

The silicide layer 10 is a metal compound layer containing a material contained in the semiconductor layer 2 (the source region 6, the contact region 5, and the field relaxation layer FRL) and a metal. The metal is, for example, nickel (Ni), and the silicide layer 10 is a metal silicide layer, for example, a nickel silicide (NiSi) layer. The source region 6, the contact region 5, and the field relaxation layer FRL are in ohmic contact with the silicide layer 10.

Hereinafter, parameters such as the depth and the impurity concentration of each configuration in the first embodiment will be described. Each depth shown below is a depth from a front surface of the semiconductor layer 2. In other words, each depth is a thickness of each impurity region.

The n type semiconductor substrate 1 has an impurity concentration of, for example, $1\times10^{18}$ to $1\times10^{21}$ cm$^{-3}$.

The n type semiconductor layer 2 has a thickness of, for example, 5 to 50 nm, and has an impurity concentration of, for example, $1\times10^{14}$ to $1\times10^{17}$ cm$^{-3}$.

The n type diffusion region 3 has an impurity concentration of, for example, $1\times10^{19}$ to $1\times10^{21}$ cm$^{-3}$.

The p type body region 4 has a depth of, for example, 500 to 2000 nm, and has an impurity concentration of, for example, $1\times10^{16}$ to $1\times10^{19}$ cm$^{-3}$.

The p type contact region 5 has a depth of, for example, 100 to 1000 nm, and has an impurity concentration of, for example, $1\times10^{19}$ to $1\times10^{21}$ cm$^{-3}$.

The n type source region 6 has a depth of, for example, 100 to 1000 nm, and has an impurity concentration of, for example, $1\times10^{19}$ to $1\times10^{21}$ cm$^{-3}$.

The p type field relaxation layer FRL has a depth of, for example, 50 to 300 nm, and has an impurity concentration of, for example, $1\times10^{16}$ to $1\times10^{21}$ cm$^{-3}$. The depth of the field relaxation layer FRL is smaller than the depth of the body region 4, for example, equal to or less than half the depth of the body region 4. In other words, a location of a bottom portion of the field relaxation layer FRL is smaller than a location of a bottom portion of the body region 4.

Each MISFET 1Q includes at least the body region 4, the gate insulating films 7, the gate electrode 8, the source region 6, and the semiconductor layer 2 on the side surface 8b side of the gate electrode 8. Each JFET 2Q includes at least the field relaxation layer FRL, the source electrode 11 on the field relaxation layer FRL, and the semiconductor layer 2 on the side surface 8b side of the gate electrode 8.

The gate electrode 8 functions as a gate of the MISFET 1Q, the source region 6 (the source electrode 11) functions as a source of the MISFET 1Q, the semiconductor layer 2 (the drain electrode 13) functions as a drain of the MISFET 1Q, and the body region 4 located below the gate electrode 8 functions as a channel region of the MISFET 1Q.

The field relaxation layer FRL and the body region 4 function as a gate of the JFET 2Q, the source electrode 11 functions as a source of the JFET 2Q, and the semiconductor layer 2 (the drain electrode 13) functions as a drain of the JFET 2Q.

Then, as described above, since the field relaxation layer FRL and the body region 4 are electrically connected to the source electrode 11, a source voltage Vs is applied to the gate and the source of the JFET 2Q. Therefore, the gate and the source of the JFET 2Q are connected to the source of the MISFET 1Q, and the drain of the JFET 2Q is connected to the drain of the MISFET 1Q. The connection relationship is shown by an equivalent circuit as shown in FIG. 4. That is, in the first embodiment, the JFET 2Q, which is the rectifying element, is connected in parallel in a direction opposite to the MISFET 1Q, which is the switching element, and functions as the reflux diode.

In the first embodiment, each cell includes one MISFET 1Q and one JFET 2Q. A plurality of cells are included in the semiconductor device, and as shown in FIG. 1, the structures of each two cells adjacent to each other are inverted symmetrical. That is, in each two cells adjacent to each other, the body regions 4, the gate insulating films 7, the gate electrodes 8, the source regions 6, and the field relaxation layers FRL are provided line symmetrically with respect to a central portion of the silicide layer 10 on the field relaxation layers FRL. When two of the cells provided line symmetrically are set as one unit cell, a plurality of the unit cells are provided periodically in the X direction.

Operations of the MISFET 1Q as the switching element and the JFET 2Q as the rectifying element will be described below with reference to FIGS. 5 to 8. FIGS. 5 to 8 are enlarged cross-sectional views showing operations of the MISFET 1Q and the JFET 2Q when the gate voltage Vg, the source voltage Vs, and the drain voltage Vd, which are voltages applied to the gate electrode 8, the source electrode 11, and the drain electrode 13 respectively, are changed. A voltage Vth is a threshold voltage of the MISFET 1Q, and a voltage Vf is a rising voltage of the JFET 2Q. Here, the source voltage Vs is a ground voltage (reference voltage), and is, for example, 0 V (zero volt). A rising voltage of each of the body diode and the JFET 2Q is set to a voltage at which current starts to conduct when the voltage is less than the drain voltage Vd.

Figure 5:
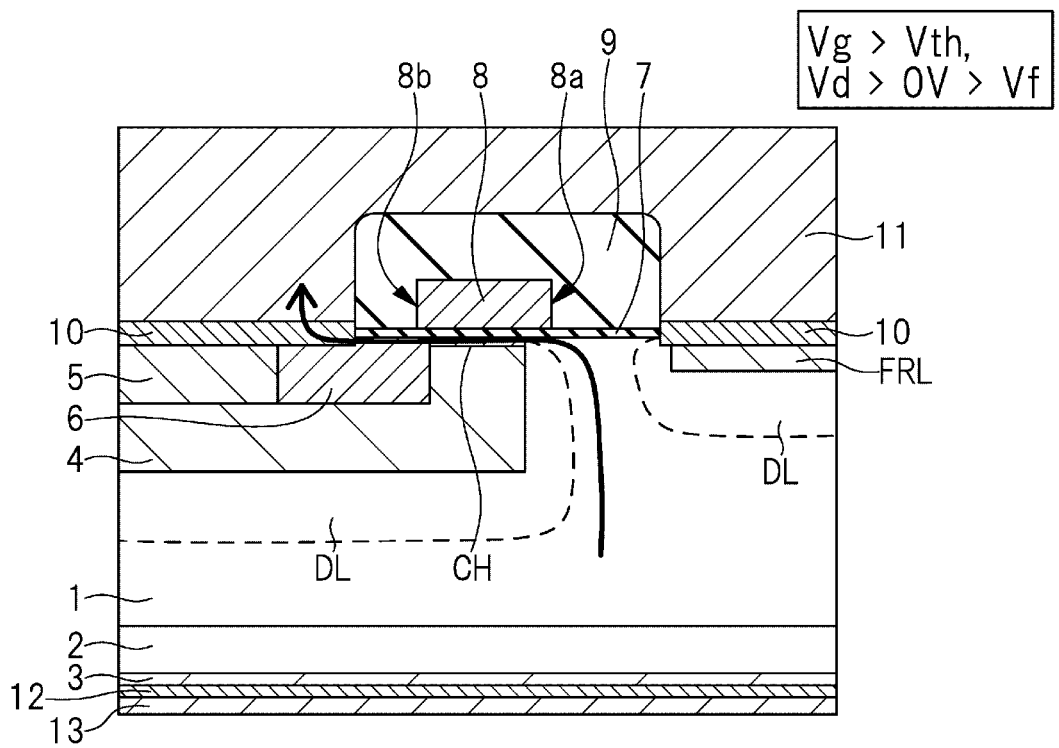
FIG. 5 is an enlarged cross-sectional view showing an operation of the semiconductor device according to a change in each voltage.

FIG. 5 shows a case where the gate voltage Vg>the threshold voltage Vth and the drain voltage Vd>0V>the rising voltage Vf.

As shown in FIG. 5, in the case of such a voltage relationship, a depletion layer DL is generated around the body region 4 and the field relaxation layer FRL. Here, in the JFET 2Q, since a current path between the source electrode 11 and the drain electrode 13 is blocked by the depletion layer DL, the JFET 2Q is set to be in an off state. On the other hand, in the MISFET 1Q, a channel region CH is generated on a front surface of the body region 4 under the gate electrode 8. As indicated by an arrow in the drawing, since current flows through the channel region CH, the MISFET 1Q is set to be in an on state.

Figure 6:
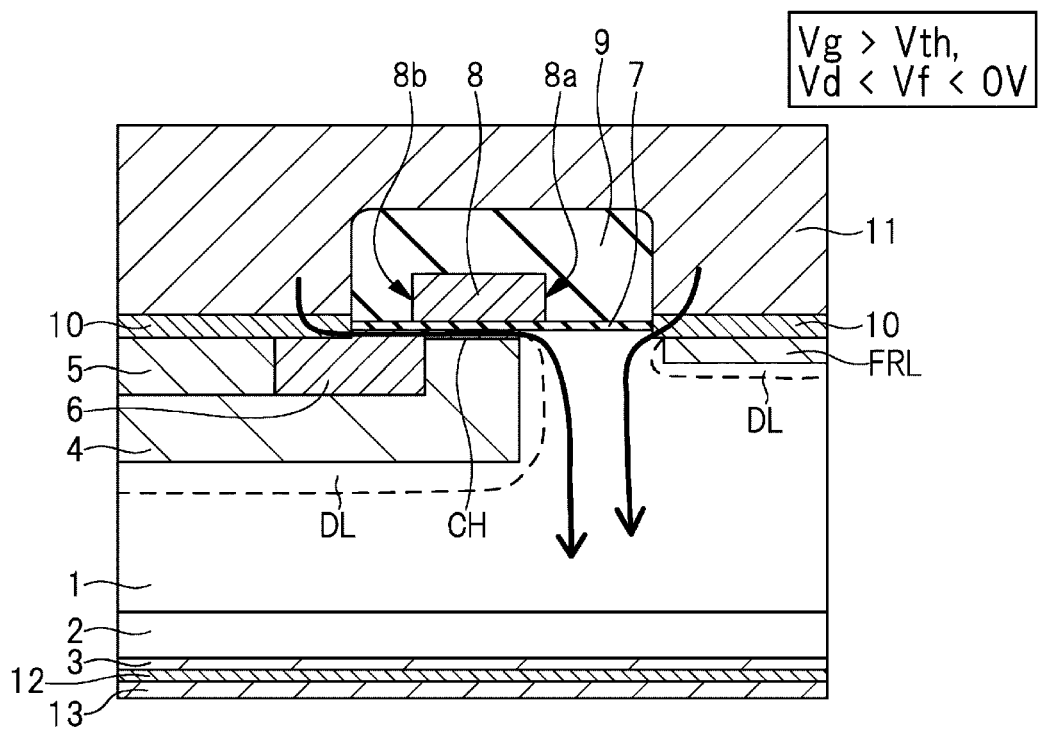
FIG. 6 is an enlarged cross-sectional view showing the operation of the semiconductor device according to the change in each voltage.

FIG. 6 shows a case where the gate voltage Vg>the threshold voltage Vth, and the drain voltage Vd<the rising voltage Vf<0V.

As shown in FIG. 6, even in the case of such a voltage relationship, the depletion layer DL is generated around the body region 4 and the field relaxation layer FRL, but a width of the depletion layer DL is smaller than that in FIG. 5. Therefore, in the MISFET 1Q, although the channel region CH is generated and the current flows in a similar manner as in FIG. 5, and in the JFET 2Q, since the depletion layer DL does not spread to an extent of blocking the current path, the JFET 2Q is set to be in the on state.

Figure 7:
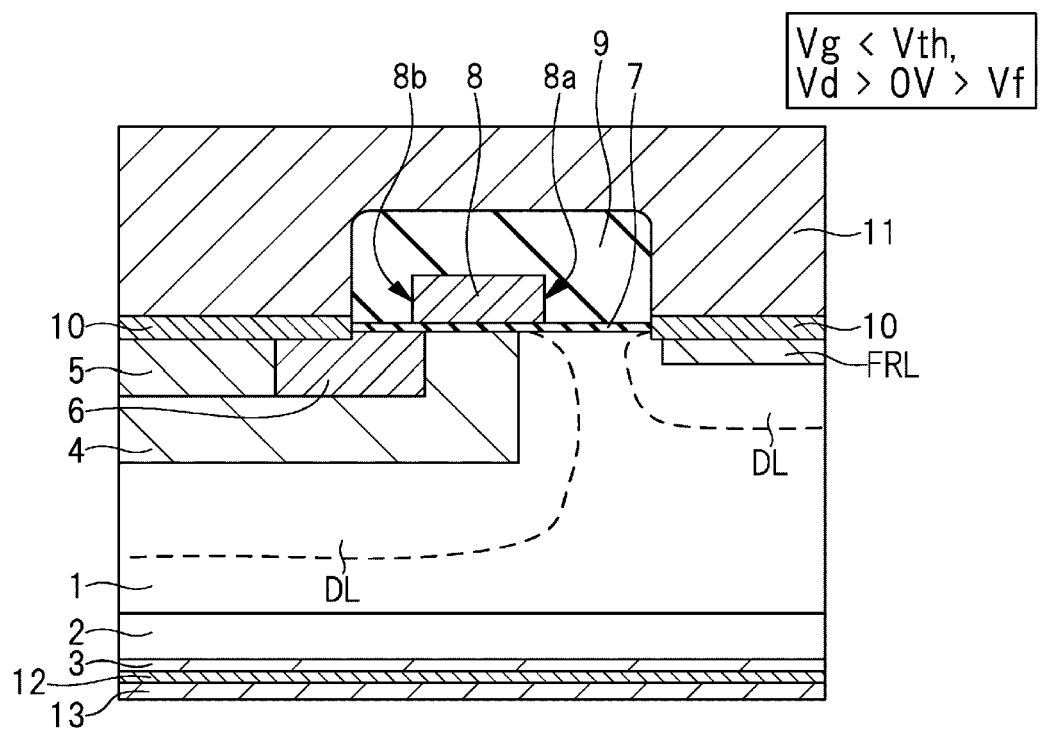
FIG. 7 is an enlarged cross-sectional view showing the operation of the semiconductor device according to the change in each voltage.

FIG. 7 shows a case where the gate voltage Vg<the threshold voltage Vth and the drain voltage Vd>0V>the rising voltage Vf.

As shown in FIG. 7, in the case of such a voltage relationship, although a depletion layer DL is generated around the body region 4 and the field relaxation layer FRL similar as in FIG. 5, in the MISFET 1Q, unlike FIG. 5, the channel region CH is not generated. Therefore, the MISFET 1Q and the JFET 2Q are set to be in the off state.

Figure 8:
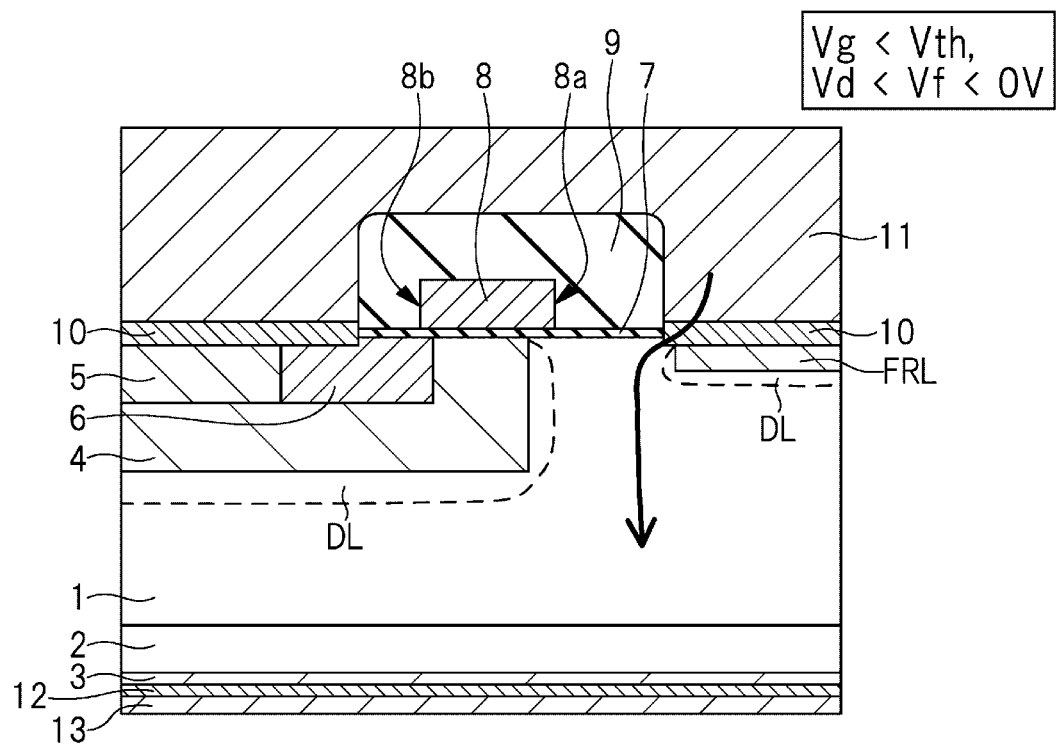
FIG. 8 is an enlarged cross-sectional view showing the operation of the semiconductor device according to the change in each voltage.

FIG. 8 shows a case where the gate voltage Vg<the threshold voltage Vth and the drain voltage Vd<the rising voltage Vf<0V.

As shown in FIG. 8, in the case of such a voltage relationship, since the channel region CH is not generated, although the MISFET 1Q is set to be in the off state, the JFET 2Q is set to be in the on state.

In the MISFET 1Q, a switching operation is frequently performed by changing the gate voltage Vg and the drain voltage Vd. Therefore, although the states shown in FIGS. 5 to 8 may frequently occur, in the first embodiment, the JFET 2Q functions as a reflux diode. For example, as described above, instead of the JFET 2Q, when the pn type body diode that includes the body region 4 and the semiconductor layer 2 is used as the reflux diode, bipolar current may be generated, and there is a risk that crystal defects inside the SiC substrate progress.

As can be seen from the description of FIGS. 5 to 8, the JFET 2Q is a normally off type element and functions as a unipolar rectifying element. Therefore, as in the first embodiment, if the JFET 2Q formed separately from the body diode is used as the reflux diode, and the possibility of the progressing of the crystal defects inside the SiC substrate can be prevented.

Since the body diode is also set to be in the on state when the rising voltage of the body diode is larger than the applied drain voltage Vd, an ON voltage of the JFET 2Q at a current amount assumed during use is preferably designed to be larger than the rising voltage of the body diode.

Since the ON voltage is determined by the current×the resistance, it is effective to reduce a resistance value of the rectifying element in order to reduce the ON voltage. In the first embodiment, the depth of the field relaxation layer FRL is designed to be smaller than the depth of the body region 4. Therefore, a JFET length of the JFET 2Q can be shortened, the resistance value can be reduced, and the turn-on of the body diode can be prevented.

The characteristics of the semiconductor device of the first embodiment and other features will be described below with reference to the following examined examples.

Examined Example

Figure 9:
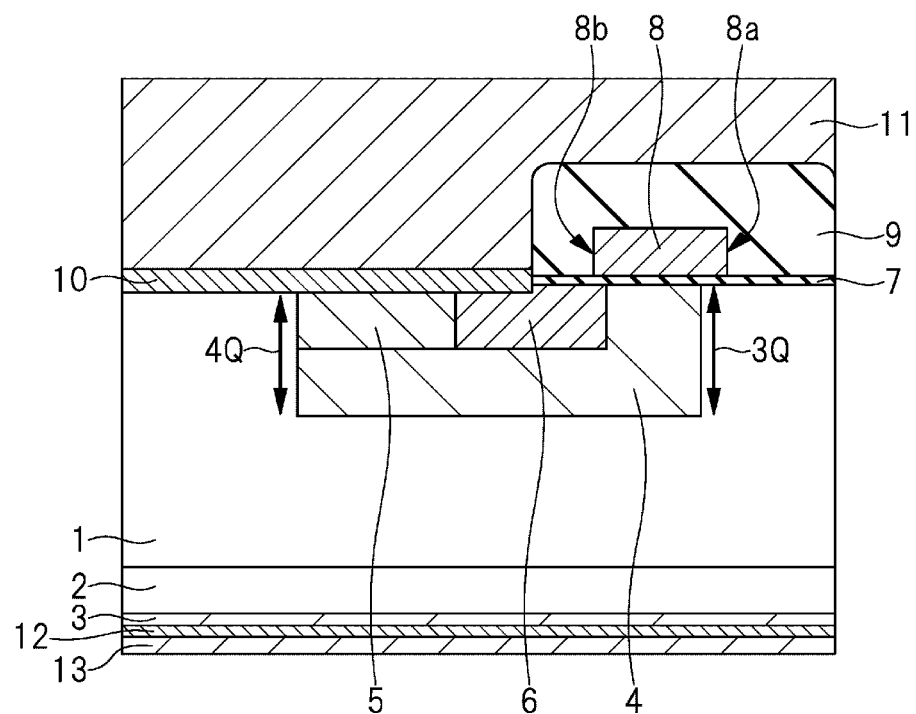
FIG. 9 is a cross-sectional view showing a semiconductor device according to a first examined example.
Figure 10:
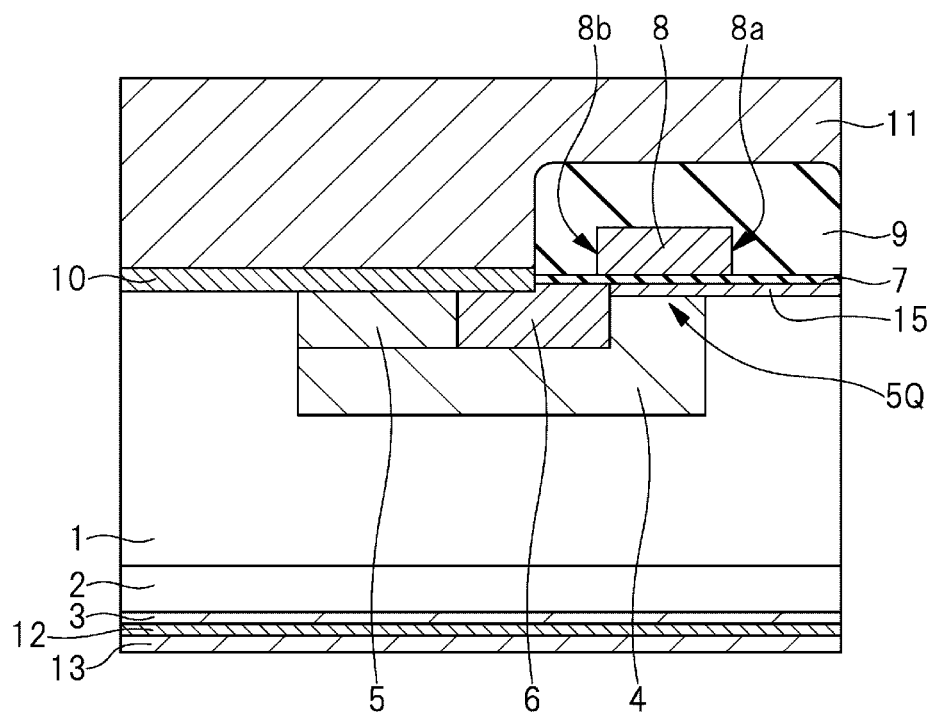
FIG. 10 is a cross-sectional view showing a semiconductor device according to a second examined example.
Figure 11:
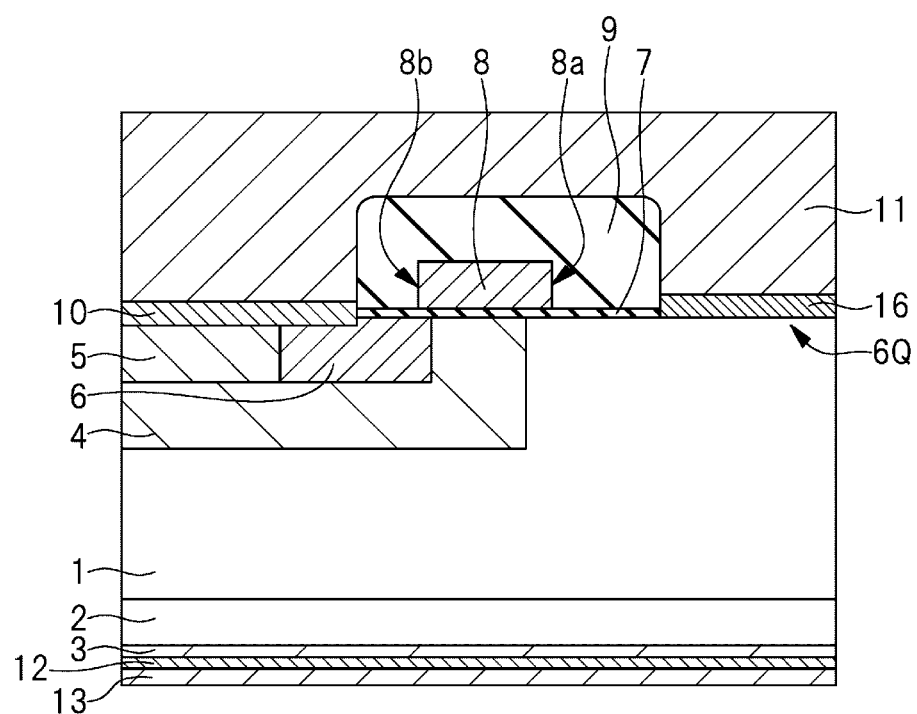
FIG. 11 is a cross-sectional view showing a semiconductor device according to a third examined example.

With reference to FIGS. 9 to 11, the semiconductor device in the first to third examined examples examined by the inventors of the present application will be described below. The semiconductor devices according to the first to third examined examples are based on the techniques disclosed in PTLs 1 to 3.

First Examined Example

As shown in FIG. 9, although the structure of the MISFET according to the first examined example is almost the same as the structure of the MISFET 1Q according to the first embodiment, a JFET 3Q having no field relaxation layer FRL is provided on the side surface 8b side of the gate electrode 8, and a JFET 4Q is provided on the side surface 8a side (source region 6 side) of the gate electrode 8.

In the first examined example 1, in order to provide the JFET 4Q on the source region 6 side, there is a problem that a cell pitch in the X direction increases. Since the JFET 4Q has a large resistance value due to a long JFET length, the bipolar current cannot be prevented. That is, it is necessary for the rectifying element rectify in a sufficiently low resistance state so as to reduce the ON voltage, and otherwise, the body diode is set to be in the on state first.

Since an absolute value of the ON voltage during a rated operation in a forward direction of the generally designed MISFET is larger than an absolute value of the rising voltage of the body diode when a voltage in a reversed direction is applied, a requirement for a unipolar rectification is "the absolute value of the ON voltage during the rectification operation<the absolute value of the ON voltage during a rated operation of the MISFET". The JFET lengths of the JFET 3Q and the JFET 4Q are equal in structure. Therefore, when the JFET 4Q is of a normally off type, the JFET 4Q is always higher in resistance than the JFET 3Q. Therefore, the absolute value of the ON voltage during the rectification operation>the absolute value of the ON voltage during the rated operation of the MISFET, and the structure of the first examined example cannot satisfy the requirement.

On the other hand, in the first embodiment, since no rectifying element is formed on the source region 6 side, the cell pitch is not increased, which is advantageous for miniaturization of the semiconductor device. As described above, since the depth of the field relaxation layer FRL in the first embodiment is smaller than the depth of the body region 4, the resistance value of the JFET 2Q, which is a rectifying element, is sufficiently small, and the bipolar current can be prevented. That is, since the resistance value of the JFET 2Q can be designed to be smaller than the resistance value of the channel region CH of the MISFET 1Q, a condition of "the absolute value of the ON voltage during the rectification operation<the absolute value of the ON voltage during the rated operation of the MISFET" can be easily achieved.

Second Examined Example

As shown in FIG. 10, in the second examined example, no field relaxation layer FRL is formed on the side surface 8b side of the gate electrode 8, and a low concentration impurity region 15 is formed on the front surface of the body region 4 under the gate electrode 8. The MISFET of the second examined example functions as a channel diode 5Q that allows the unipolar current to flow from the source electrode 11 to the drain electrode 13.

However, in the second examined example, it is necessary to separate a channel for a normal MISFET operation and a channel for a channel diode 5Q, which is a rectifying element, the resistance value per unit area is deteriorated, and the performance of a semiconductor element significantly decreases. There is a possibility that variations in current in the semiconductor chip are likely to occur due to the separation of the channel, and various characteristics such as short circuit tolerance may also be deteriorated. Since the short circuit tolerance is a breakdown due to excessive temperature rise inside the semiconductor chip, the short circuit tolerance is deteriorated due to local heat generation.

On the other hand, in the first embodiment, since the rectifying element is included in a basic unit cell, it is not necessary to separate the cell, and the decrease of the performance of the semiconductor chip (semiconductor device) is prevented. Since the rectifying elements exist in each cell, the current in the semiconductor chip tends to be uniform.

Third Examined Example

As shown in FIG. 11, although the structure of the MISFET according to the third examined example is almost the same as the structure of the MISFET 1Q of the first embodiment, the field relaxation layer FRL is not formed on the side surface 8b side of the gate electrode 8. Instead, a metal layer 16 is formed between the semiconductor layer 2 and the source electrode 11, and a Schottky barrier diode (SBD) 6Q is provided.

When the SBD 6Q is provided in the semiconductor chip, since it is necessary for the semiconductor layer 2 and the metal layer 16 to be Schottky connected, the metal layer 16 is formed separately from a metal layer for forming the silicide layer 10. Therefore, a manufacturing process becomes complicated, and manufacturing cost is also increased. Since a Schottky junction has a large influence on an interface state such as roughness of the front surface of the semiconductor layer 2, it is difficult to control a good Schottky junction, and there is a risk that a yield is reduced.

On the other hand, the semiconductor device of the first embodiment does not include a Schottky junction, and only an ohmic junction of the silicide layer 10 is formed. Therefore, the manufacturing process can be simplified, and an increase in manufacturing cost can be prevented. In the ohmic junction, since the silicide layer 10 as an intermediate layer is formed at an interface, an influence of the roughness of the front surface of the semiconductor layer 2 is very small. An opening width of the JFET 2Q can be adjusted by the depth of the field relaxation layer FRL, and the rising voltage Vf can be designed freely.

As described above, according to the first embodiment, the increase in the manufacturing cost of the semiconductor device can be prevented, and the performance of the semiconductor device can be improved.

Second Embodiment

Figure 12:
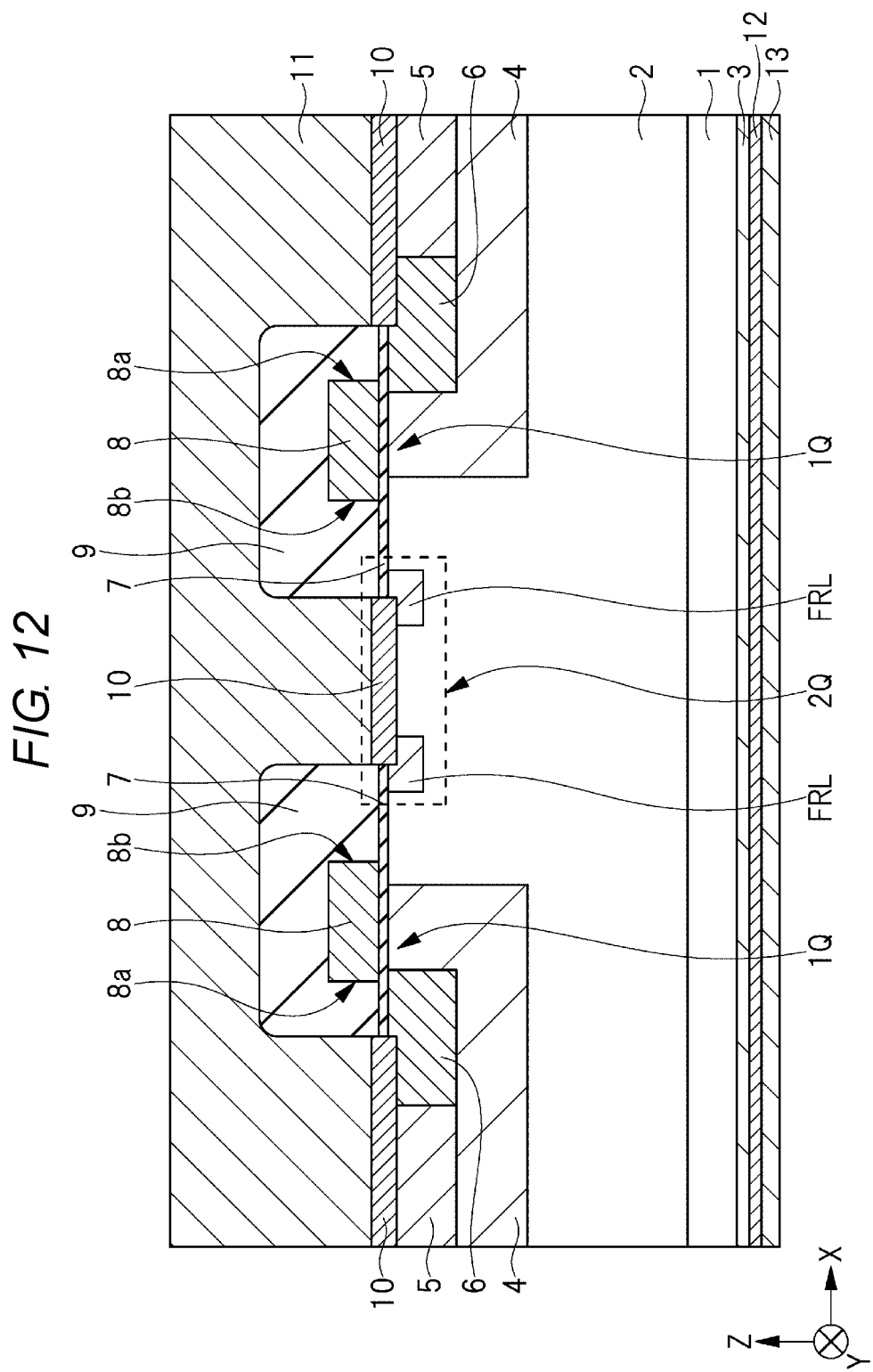
FIG. 12 is a cross-sectional view showing a semiconductor device according to a second embodiment.

A semiconductor device according to the second embodiment will be described below with reference to FIG. 12. In the following description, differences from the first embodiment will be mainly described.

In the first embodiment, one field relaxation layer FRL is provided under the silicide layer 10, whereas in the second embodiment, the field relaxation layer FRL is provided in a manner of covering an end portion of the silicide layer 10 and forming an opening in the central portion of the silicide layer 10.

In the second embodiment, since each two cells are provided line symmetrically, the field relaxation layer FRL of one cell covers one end portion of the silicide layer 10, and the field relaxation layer FRL of the other cell covers the other end portion of the silicide layer 10. In the second embodiment, the field relaxation layer FRL is separated from the body region 4 in the X direction.

In the structure of the first embodiment, it may be difficult to achieve both of controlling the width of the depletion layer which is necessary for the JFET 2Q to be a normally off type and not increasing a resistance during the operation of the MISFET 1Q. For example, in the case of a device in which the gate voltage Vg is a negative voltage when the MISFET 1Q is in the OFF state, the semiconductor side surface of the gate insulating film 7 is set to be in an accumulation state with a majority carrier appears thereon, and the depletion layer does not extend. That is, it is difficult to maintain the JFET 2Q in a normally off type due to the opening of the depletion layer from the field relaxation layer FRL. Although the gate and the source of the JFET 2Q are short-circuited in a circuit, actually, a signal delay may occur due to the resistance of the semiconductor layer 2.

In the second embodiment, the width of the depletion layer is adjusted by the two field relaxation layers FRL provided at both end portions of the silicide layer 10, and the operation of the JFET 2Q is controlled. That is, when the JFET 2Q is in the OFF state, the current path to the source electrode 11, the silicide layer 10, the semiconductor layer 2, and the drain electrode 13 is blocked by the depletion layer generated around the two field relaxation layers FRL. When the JFET 2Q is in the ON state, the current flows through the semiconductor layer 2 between the two field relaxation layers FRL.

In this manner, in the JFET 2Q in the second embodiment, effect due to charge accumulation of the gate insulating film 7 (interlayer insulating film 9) does not exist, and the normally off type rectifying element can be designed independently from the operation of the MISFET 1Q. Since the two field relaxation layers FRL and the semiconductor layer 2 therebetween are electrically connected to the source electrode 11 with the silicide layer 10, which is formed in the opening portion of the interlayer insulating film 9, interposed therebetween, controllability of the voltage of the gate and the source of the JFET 2Q can be improved.

Third Embodiment

Figure 13:
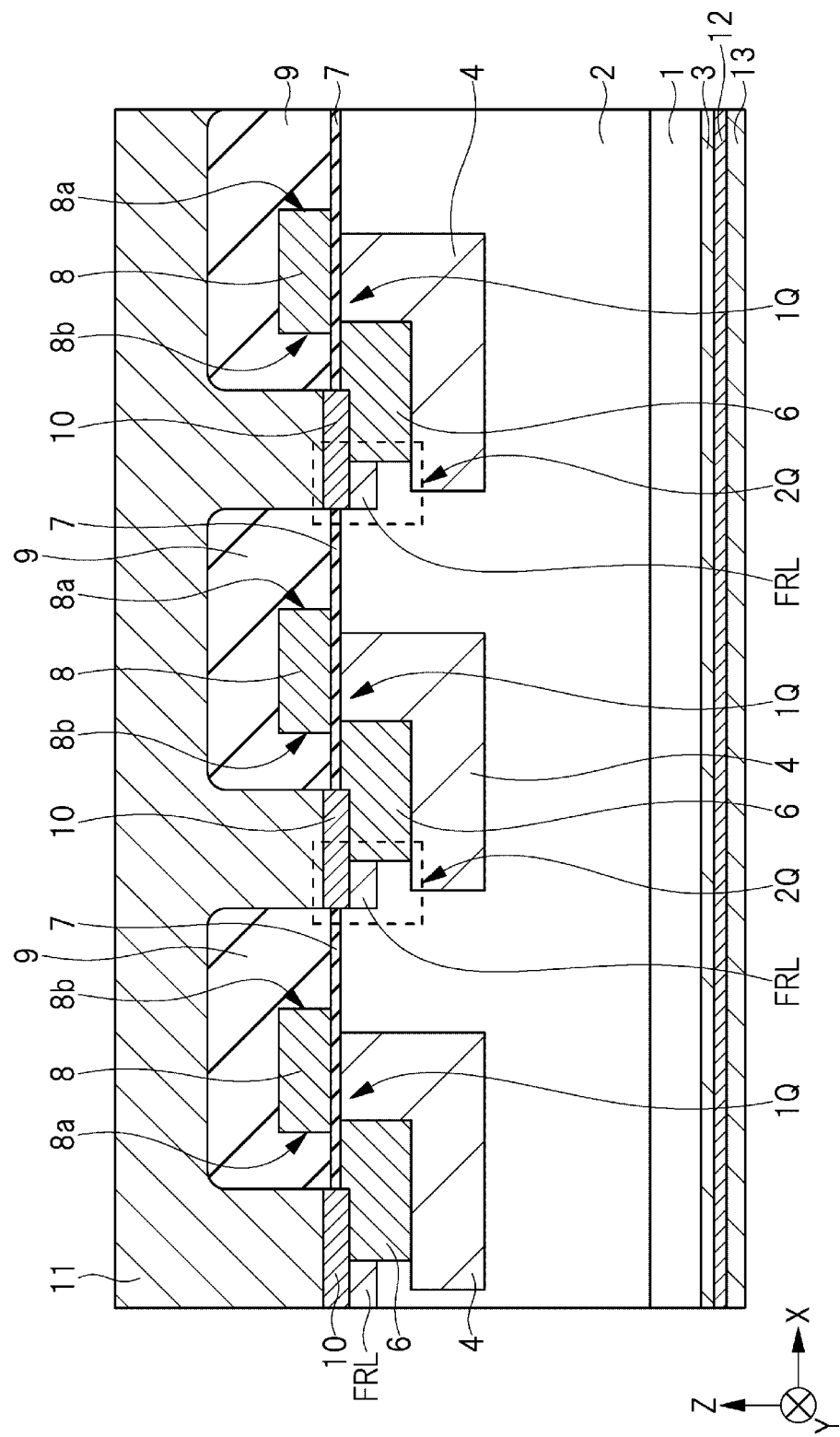
FIG. 13 is a cross-sectional view showing a semiconductor device according to a third embodiment.

A semiconductor device according to the third embodiment will be described below with reference to FIG. 13. In the following description, differences from the first embodiment and the second embodiment will be mainly described.

Although in the first embodiment and the second embodiment, two cells are provided line symmetrically, in the third embodiment, a plurality of cells having the same structure are provided periodically in the X direction.

When the structure of the JFET 2Q is formed in the X direction as in the first embodiment and the second embodiment, a region for forming the field relaxation layer FRL is necessary, and it is difficult to apply to a device due to a narrow gap between each two adjacent body layers 4. The width of the field relaxation layer FRL itself, the distance between the field relaxation layer FRL and the body region 4, and the distance between the two field relaxation layers FRL are set by photolithography technology and ion implantation. In this case, if there is no advanced exposure development technology, a problem may be caused, for example, the width of the field relaxation layer FRL may vary due to mask deviation or the like. The above causes a problem that the rising voltage Vf of the JFET 2Q becomes non-uniform or the JFET 2Q does not operate.

From the above viewpoint, in the third embodiment, the JFET 2Q is configured in a vertical direction (Z direction). In the third embodiment, similar as in the second embodiment, the field relaxation layer FRL is provided in a manner of covering the end portion of the silicide layer 10 and forming an opening in the central portion of the silicide layer 10. Then, the field relaxation layer FRL in the third embodiment is in contact with the source region 6 of an adjacent cell and is separated from the body region 4 of the adjacent cell in the Z direction.

When the JFET 2Q is in the OFF state, the current path to the source electrode 11, the silicide layer 10, the source region 6, the semiconductor layer 2, and the drain electrode 13 is blocked by the depletion layer generated around the field relaxation layers FRL located above and below and the body region 4. When the JFET 2Q is in the ON state, the source region 6 and the semiconductor layer 2 serve as a current path. The body region 4 according to the third embodiment is electrically connected to the source electrode 11 by a contact region 5 that divides the source region 6 as shown in FIG. 3, for example.

In this manner, in the JFET 2Q in the third embodiment, since the field relaxation layer FRL and the body region 4 are arranged in an above and below manner, it is not necessary to increase the cell pitch. Therefore, miniaturization of the semiconductor device can be promoted. In addition, since the JFET 2Q may not be formed at the center of two line-symmetric cells, a degree of design freedom is improved, and the JFET 2Q can be applied to various cell pitches.

Since the JFET 2Q has a vertical structure, an influence of mask deviation is very small. Since the implantation energy at the time of ion implantation can be controlled with high accuracy, the vertical structure can be relatively easily achieved, and an opening width of the JFET 2Q can be uniformized. That is, since it is possible to design a device having high reproducibility, it is possible to improve reliability of the semiconductor device.

Fourth Embodiment

Figure 14:
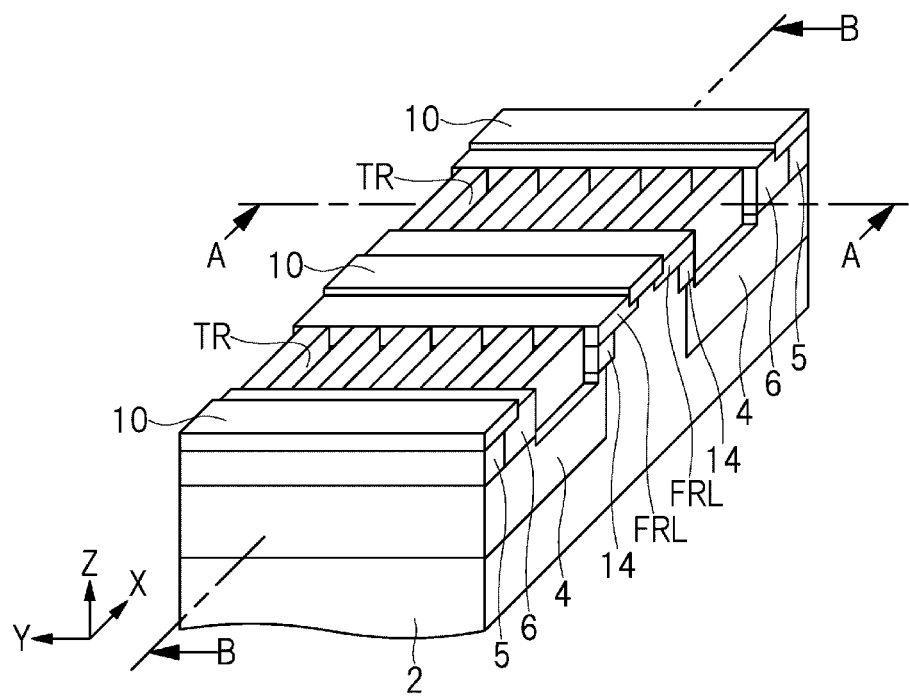
FIG. 14 is a perspective view showing a semiconductor device according to a fourth embodiment.
Figure 15:
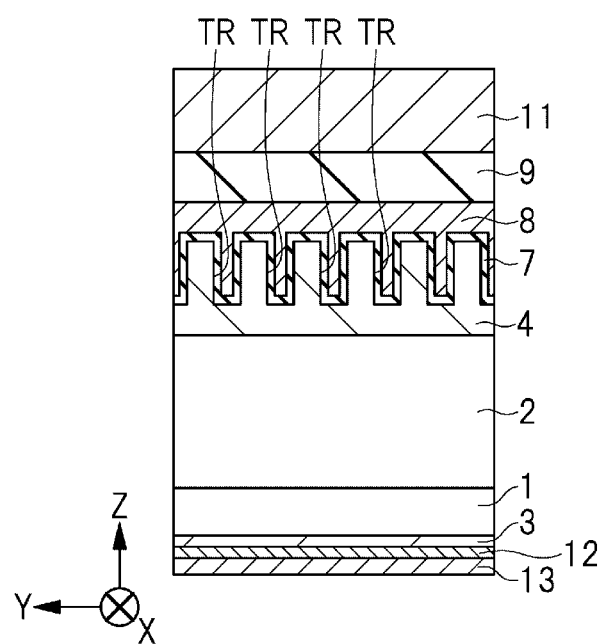
FIG. 15 is a cross-sectional view showing a semiconductor device according to the fourth embodiment.

A semiconductor device according to the fourth embodiment will be described below with reference to FIGS. 14 to 16. In the following description, differences from the second embodiment will be mainly described. FIG. 14 is a perspective view showing the semiconductor device according to the fourth embodiment. FIG. 15 is a cross-sectional view taken along line A-A in FIG. 14, and FIG. 16 is a cross-sectional view taken along line B-B of FIG. 14.

Although in the first to third embodiments, the MISFET 1Q is a planar type, in the fourth embodiment, the MISFET 1Q is a trench gate type.

Figure 16:
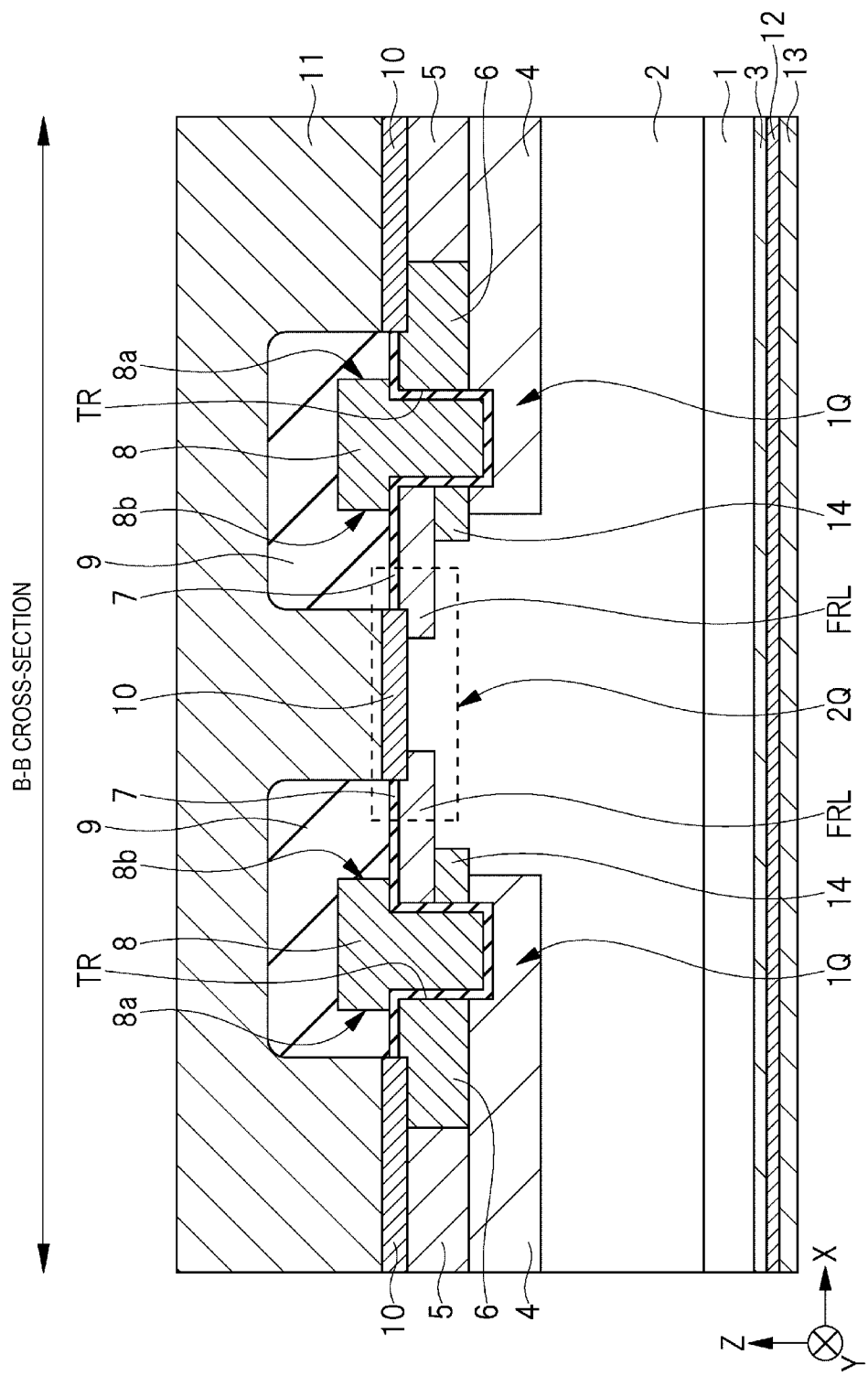
FIG. 16 is a cross-sectional view showing the semiconductor device according to the fourth embodiment.

As shown in FIGS. 14 and 16, in the semiconductor device according to the fourth embodiment, an n type current diffusion region 14 is formed in the body region 4 and the semiconductor layer 2 on the side surface 8b side of the gate electrode 8. The current diffusion region 14 has a depth of, for example, 100 to 1000 nm, and has an impurity concentration of, for example, $5 \times 10^{17}$ to $5 \times 10^{18}$ cm$^{-3}$. The drain voltage Vd is applied to the current diffusion region 14 from the drain electrode 13 with the semiconductor layer 2 interposed therebetween, the semiconductor substrate 1, the diffusion region 3, and the silicide layer 12.

As shown in FIGS. 14 to 16, a plurality of trenches TR are formed in the body region 4 so as to penetrate the source region 6 and the current diffusion region 14. The trenches TR extend in the X direction and are adjacent to each other in the Y direction. In the X direction, one side wall of each trench TR is in contact with the source region 6, and the other side surface of each trench TR is in contact with the current diffusion region 14. A bottom wall of each trench TR is in contact with the body region 4. Each gate electrode 8 is buried in each trench TR with each gate insulating film 7 interposed therebetween.

In such a trench gate type MISFET 1Q, a path from the current diffusion region 14 to the source region 6 with the body region 4 interposed therebetween serves as a current path. Since the body region 4 between the adjacent trenches TR constitutes most part of the channel region, a high channel mobility is obtained in the fourth embodiment comparing with the first to third embodiments.

The field relaxation layer FRL is located above the current diffusion region 14 and is in contact with the other side wall of each trench TR in the X direction. In the fourth embodiment, the field relaxation layer FRL is formed in a manner of forming an opening in the central portion of the silicide layer 10 to and covering the end portion of the silicide layer 10. In the fourth embodiment, since each two cells are provided line symmetrically, the field relaxation layer FRL of one cell covers one end portion of the silicide layer 10, and the field relaxation layer FRL of the other cell covers the other end of the silicide layer 10.

Therefore, when the JFET 2Q is in the OFF state, the current path to the source electrode 11, the silicide layer 10, the semiconductor layer 2, and the drain electrode 13 is blocked by the depletion layer generated around the two field relaxation layers FRL. When the JFET 2Q is in the ON state, the current flows through the semiconductor layer 2 between the two field relaxation layers FRL.

In the planar type, since a channel outlet has a two-dimensional structure, it may be difficult to arrange the JFET 2Q so as not to adversely affect the resistance on the MISFET 1Q side. In the planar type, an insulating film field at the time of blocking is large, and in general, a width between the body regions 4 of two adjacent cells is narrow. In a case of a design in which the width between the two body regions 4 is narrow, a space in which the JFET 2Q is arranged may not be secured.

In a three-dimensional structure as in the fourth embodiment, since the channel outlet is widened in a depth direction, the resistance on the MISFET 1Q side is not affected if the JFET 2Q is arranged. Since the insulating film field is small in the trench gate type, the width between the two body regions 4 can be widened. Therefore, the trench gate type MISFET 1Q has good compatibility with the JFET 2Q formed between the two body regions 4. Therefore, the degree of the design freedom of the JFET 2Q can be increased, and it is easy to improve the performance of the semiconductor device.

While the invention made by the present inventors has been specifically described based on the embodiments, the invention is not limited to the embodiments described above, and various changes and modifications may be made without departing from the scope of the invention.

What is claimed is:

1. A semiconductor device, comprising:
   a semiconductor substrate of a first conductivity type that has a front surface and a back surface which is on an opposite side of the front surface, and contains silicon carbide;
   a first semiconductor layer of the first conductivity type that is formed on the front surface of the semiconductor substrate, and contains silicon carbide;
   a body region of a second conductivity type that is opposite to the first conductivity type formed in the first semiconductor layer, the body region comprising a channel of a metal insulator semiconductor field effect transistor (MISFET) and a gate of a junction field effect transistor (JFET);
   a gate insulating film that is formed on the body region;
   a gate electrode that is formed on the gate insulating film, has a first side surface and a second side surface which is on an opposite side of the first side surface in a first direction, and extends in a second direction orthogonal to the first direction in a plan view;
   a source region of the first conductivity type that is formed in the body region on the first side surface side of the gate electrode;
   a source electrode that is formed on the body region and on the source region, and is electrically connected to the body region and the source region, the source electrode comprising a source of the MISFET and the JFET; and
   a drain electrode that is formed on the back surface side of the semiconductor substrate, the drain electrode comprising a drain of the JFET and the MISFIT, the gate and the source of the JFET being connected to the source of the MISFIT whereby the JFET acts as a reflux diode without drawing bipolar current;

wherein a field relaxation layer of the second conductivity type is formed in the first semiconductor layer on the second side surface side of the gate electrode, the source electrode is also formed on the field relaxation layer and is electrically connected to the field relaxation layer, and a depth of the field relaxation layer is smaller than a depth of the body region.

2. The semiconductor device according to claim 1, wherein a first metal compound layer that contains a material contained in the first semiconductor layer and a first metal is formed between the field relaxation layer and the source electrode.

3. The semiconductor device according to claim 2, wherein a plurality of cells are formed, each of the cells including a MISFET including the body region, the gate insulating film, the gate electrode, the source region, and the first semiconductor layer on the second side surface side of the gate electrode, and a rectifying element including the field relaxation layer, the source electrode on the field relaxation layer, and the first semiconductor layer on the second side surface side of the gate electrode, in each two of the cells adjacent to each other, the body regions, the gate insulating films, the gate electrodes, the source regions, and the field relaxation layers are provided line symmetrically with respect to a central portion of the first metal compound layer, and when each two of the cells provided line symmetrically are set as one unit cell, a plurality of the unit cells are provided periodically in the first direction.

4. The semiconductor device according to claim 2, wherein in the first direction, the field relaxation layer is formed in a manner of being separated from the body region, forming an opening in a central portion of the first metal compound layer, and covering an end portion of the first metal compound layer.

5. The semiconductor device according to claim 4, wherein a plurality of cells are formed, each of the cells including a MISFET including the body region, the gate insulating film, the gate electrode, the source region, and the first semiconductor layer on the second side surface side of the gate electrode, and a rectifying element including the field relaxation layer, the source electrode on the field relaxation layer, and the first semiconductor layer on the second side surface side of the gate electrode, in each two of the cells adjacent to each other, the body regions, the gate insulating films, the gate electrodes, the source regions, and the field relaxation layers are provided line symmetrically with respect to a central portion of the first metal compound layer, and when each two of the cells provided line symmetrically are set as one unit cell, a plurality of the unit cells are provided periodically in the first direction.

6. The semiconductor device according to claim 5, wherein an interval between the field relaxation layers of each two of the cells provided line symmetrically is equal to or less than 1000 nm.

7. The semiconductor device according to claim 2, wherein a current diffusion region of the first conductivity type is formed the body region and in the first semiconductor layer on the second side surface side of the gate electrode, a trench is formed in the body region in a manner of penetrating the source region and the current diffusion region, the gate insulating film and the gate electrode are also formed inside the trench, one side wall of the trench is in contact with the source region in the first direction, the other side wall of the trench is in contact with the current diffusion region in the first direction, a bottom wall of the trench is in contact with the body region, and the field relaxation layer is located above the current diffusion region and is in contact with the other side wall of the trench in the first direction.

8. The semiconductor device according to claim 7, wherein in the first direction, the field relaxation layer is formed in a manner of forming an opening in a central portion of the first metal compound layer, and covering an end portion of the first metal compound layer.

9. The semiconductor device according to claim 8, wherein a cell includes a MISFET including the body region, the gate insulating film, the gate electrode, the source region, the first semiconductor layer on the second side surface side of the gate electrode and the current diffusion region, and a rectifying element including the field relaxation layer, the source electrode on the field relaxation layer, and the first semiconductor layer on the second side surface side of the gate electrode, and in each two of the cells adjacent to each other, the body regions, the gate insulating films, the gate electrodes, the source regions, the field relaxation layers, and the current diffusion regions are provided line symmetrically with respect to the central portion of the first metal compound layer, and when each two of the cells provided line symmetrically are set as one unit cell, a plurality of the unit cells are provided periodically in the first direction.

10. The semiconductor device according to claim 7, wherein a plurality of trenches are provided in the body region so as to be adjacent to each other in the second direction.

11. The semiconductor device according to claim 1, wherein the depth of the field relaxation layer is equal to or less than half of the depth of the body region.

12. The semiconductor device according to claim 1, wherein the depth of the field relaxation layer is equal to or less than 300 nm.

13. The semiconductor device according to claim 2, wherein the first metal compound layer is nickel silicide.

* * * * *